(12) United States Patent
Zhang et al.

(10) Patent No.: US 11,347,274 B2
(45) Date of Patent: May 31, 2022

(54) COMPUTER AND SUPPORT MEMBER

(71) Applicant: Fulian Precision Electronics (Tianjin) Co., LTD., Tianjin (CN)

(72) Inventors: Ming-Pei Zhang, TianJin (CN); Ya-Ni Zhang, Tianjin (CN); Han-Yu Li, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 84 days.

(21) Appl. No.: 16/872,700

(22) Filed: May 12, 2020

(65) Prior Publication Data

US 2021/0325934 A1  Oct. 21, 2021

(30) Foreign Application Priority Data

Apr. 17, 2020  (CN) .......................... 202010306863.7

(51) Int. Cl.
*H05K 7/12* (2006.01)
*G06F 1/16* (2006.01)
*H05K 5/02* (2006.01)
*H05K 7/14* (2006.01)

(52) U.S. Cl.
CPC .......... *G06F 1/1658* (2013.01); *H05K 5/0221* (2013.01); *H05K 7/12* (2013.01); *H05K 7/1404* (2013.01)

(58) Field of Classification Search
CPC ...... G06F 1/1658; H05K 5/0221; H05K 7/12; H05K 7/1404; H01L 23/4006
See application file for complete search history.

(56) References Cited

U.S. PATENT DOCUMENTS

| | | | | |
|---|---|---|---|---|
| 5,452,184 A | * | 9/1995 | Scholder | ................. H05K 7/12 24/297 |
| 5,831,821 A | * | 11/1998 | Scholder | ................ G06F 1/184 361/679.32 |
| 6,308,394 B1 | * | 10/2001 | Boe | ........................ H05K 7/142 174/138 G |
| 10,331,181 B2 | * | 6/2019 | Ng | ........................ H05K 7/142 |

FOREIGN PATENT DOCUMENTS

| | | |
|---|---|---|
| CN | 2804927 Y | 8/2006 |
| CN | 110278680 A | 9/2019 |
| TW | M533138 | * 12/2016 |
| TW | M533138 U | 12/2016 |

* cited by examiner

*Primary Examiner* — James Wu
*Assistant Examiner* — Hung Q Dang
(74) *Attorney, Agent, or Firm* — ScienBiziP, P.C.

(57) ABSTRACT

A computer includes a chassis, a circuit board installed in the chassis, and a support member. The support member includes a support portion, a first clamping portion, and a second clamping portion. The first clamping portion and the second clamping portion are respectively located at two ends of the support portion. The first clamping portion is configured to clamp the circuit board. The second clamping portion is configured to clamp the chassis.

6 Claims, 4 Drawing Sheets

COMPUTER AND SUPPORT MEMBER

FIELD

The subject matter herein generally relates to computers, and more particularly to a computer and a support member for supporting a circuit board in the computer.

BACKGROUND

Generally, a circuit board is fixed in a computer by only fixing one end of the circuit board in a slot with a screw. However, it is easy for the circuit board to loosen or be damaged during transportation or movement.

BRIEF DESCRIPTION OF THE DRAWINGS

Implementations of the present disclosure will now be described, by way of embodiments, with reference to the attached figures.

DETAILED DESCRIPTION

Figure 1:
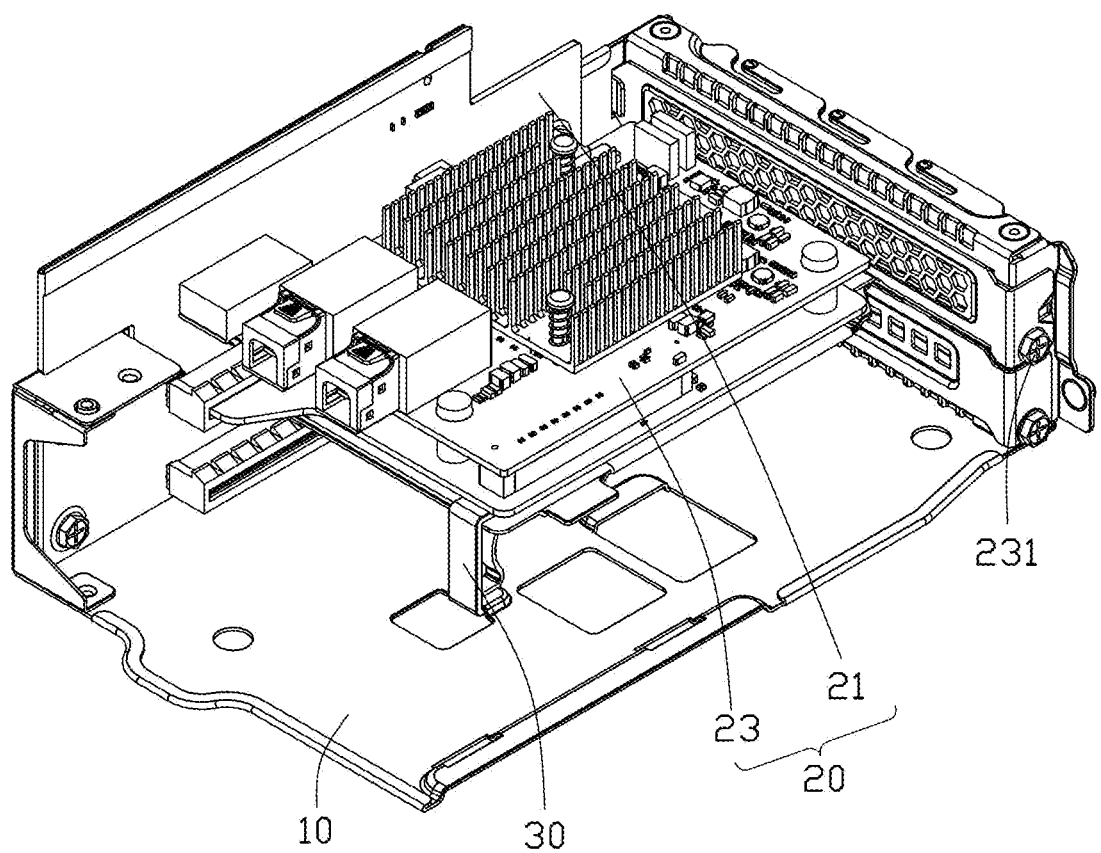
FIG. 1 is an isometric cutaway view of an embodiment of a computer including a support member.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIG. 1 shows an embodiment of a computer 100. The computer 100 includes a chassis 10, a circuit board 20 installed in the chassis 10, and a support member 30 for supporting the circuit board 20.

Figure 2:
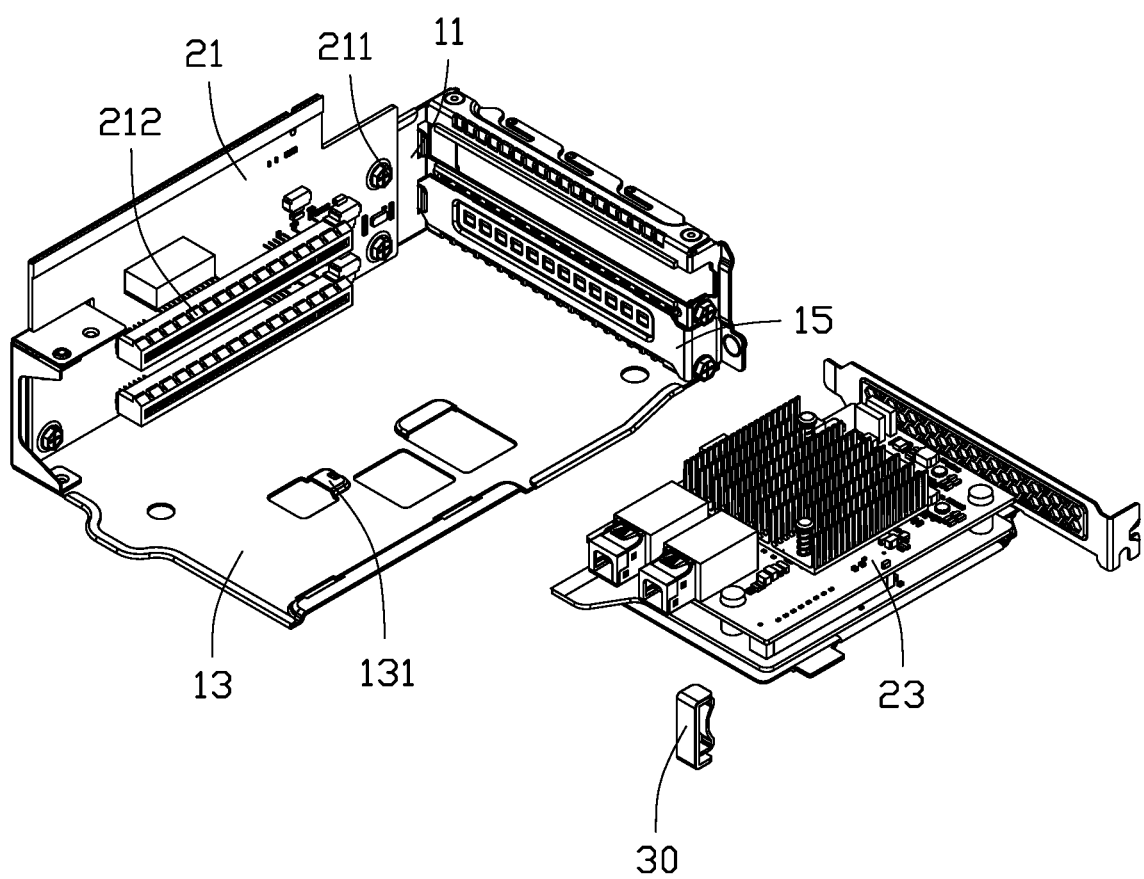
FIG. 2 is an exploded, isometric view of FIG. 1.
Figure 3:
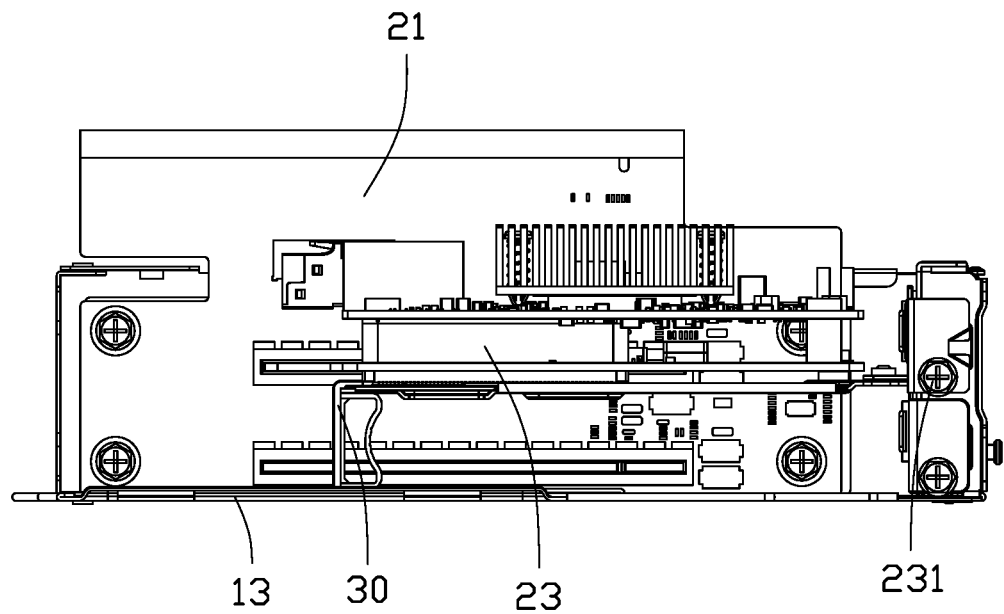
FIG. 3 is a side view of FIG. 1.
Figure 4:
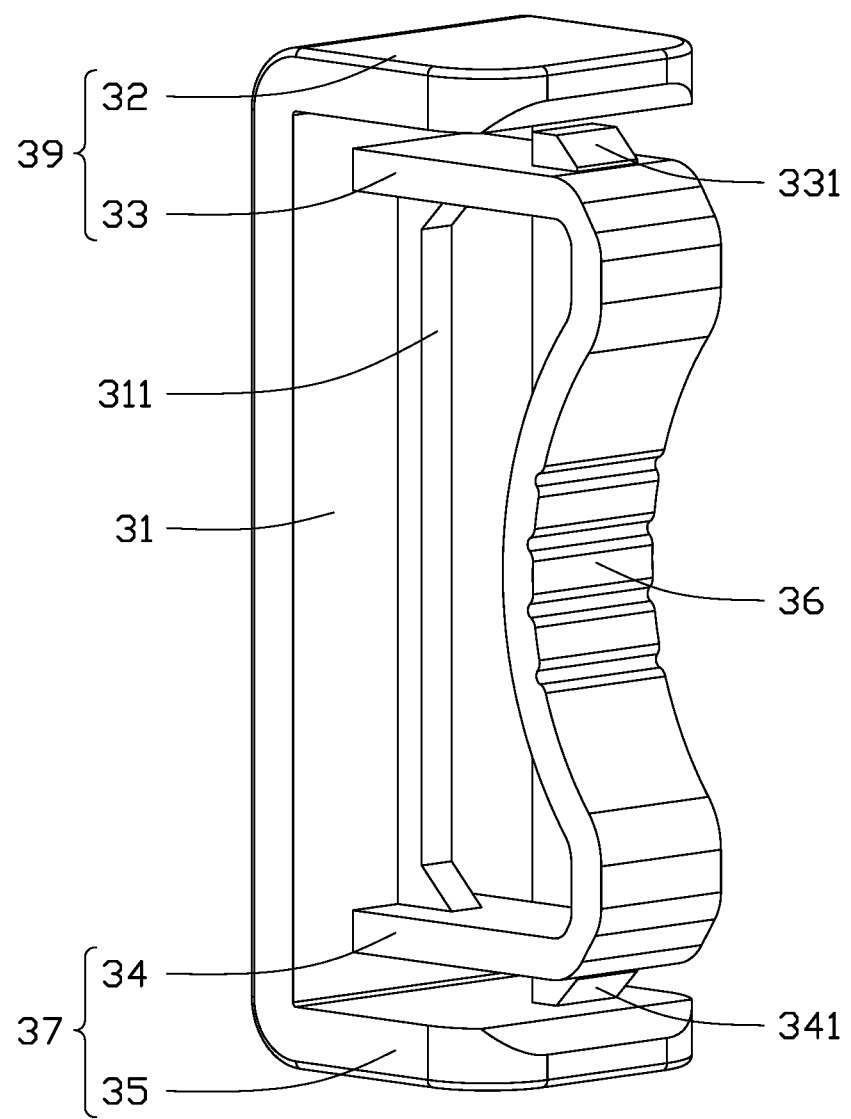
FIG. 4 is an isometric view of the support member.

Referring to FIGS. 1 and 2, the chassis 10 includes a first side wall 11, a second side wall 13, and a third side wall 15. The first side wall 11, the second side wall 13, and the third side wall 15 are perpendicular to each other.

The circuit board 20 includes a first board 21 and a second board 23. In one embodiment, the first board 21 is a Riser card, and the second board 23 is a Mezz card.

The first board 21 is fixed to the first side wall 11 of the chassis 10.

The second board 23 is installed in a slot 212 of the first board 21. The second board 23 is parallel to the second side wall 13. One end of the second board 23 is fixed to the third side wall 15 by a fixing member 231.

Referring to FIGS. 1-4, the support member 30 is connected to the chassis 10 and the second board 23 for supporting the second board 23. Specifically, the support member 30 clamps a side of the second board 23 away from the third side wall 15 and the second side wall 13.

The support member 30 includes a support portion 31, a first clamping portion 39, and a second clamping portion 37. The first clamping portion 39 and the second clamping portion 37 are respectively provided at two ends of the support portion 31. The first clamping portion 39 is used for clamping the second board 23. The second clamping portion 37 is used for clamping the second side wall 13.

Specifically, the first clamping portion 39 includes a first clamping plate 32 and a second clamping plate 33. The second clamping portion 37 includes a third clamping plate 34 and a fourth clamping plate 35. The first clamping plate 32 and the second clamping plate 33 are used for clamping the second board 23. The third clamping plate 34 and the fourth clamping plate 35 are used for clamping the second side wall 13.

In one embodiment, a side of the second clamping plate 33 facing the first clamping plate 32 is provided with a first latching block 331. The second board 23 is provided with a first latching hole (not shown). The first latching block 331 is configured to be locked in the first latching hole.

In one embodiment, a side of the third clamping plate 34 facing the fourth clamping plate 35 is provided with a second latching block 341. The second side wall 13 is provided with a second latching hole 131. The second latching block 341 is configured to be locked in the second latching hole 131.

In one embodiment, the support member 30 further includes a pressing portion 36. Two ends of the pressing portion 36 are respectively connected to the second clamping plate 33 and the third clamping plate 34. When the pressing portion 36 is pressed, the pressing portion 36 drives the second clamping plate 33 and the third clamping plate 34 to bend inward, thereby disengaging the first latching block 331 from the first latching hole and the second latching block 341 from the second latching hole 131.

When not pressed, the pressing portion 36 supports the second clamping plate 33 and the third clamping plate 34.

In one embodiment, the support portion 31 is further provided with a reinforcement block 311. The reinforcement block 311 reinforces the support portion 31.

In assembly of the computer 100, the first board 21 is fixed to the first side wall 11 of the chassis 10 through a fixing member 211. Then, the second board 23 is installed in the slot 212 of the first board 21, and one end of the second board 23 is fixed to the third side wall 15 through the fixing member 231. Then, the support member 30 is inserted, such that the first clamping plate 32 and the second clamping plate 33 clamp the second board 23, and the third clamping plate 34 and the fourth clamping plate 35 clamp the second side wall 13.

In disassembly of the computer 100, the pressing portion 36 is pressed to disengage the first latching block 331 from the first latching hole and the second latching block 341 from the second latching hole 131, so that the support member 30 can be removed. Then, the second board 23 and the first board 21 are sequentially removed.

The computer 100 supports the circuit board 20 through the support member 30 to prevent the circuit board 20 from loosening. The support member 30 is easy to assemble and disassemble, and does not require screws.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A computer comprising:
a chassis;
a circuit board installed in the chassis; and
a support member; wherein:
the support member comprises a support portion, a first clamping portion, and a second clamping portion;
the first clamping portion and the second clamping portion are respectively located at two ends of the support portion;
the first clamping portion is configured to clamp the circuit board;
the second clamping portion is configured to clamp the chassis;
the first clamping portion comprises a first clamping plate and a second clamping plate;
the second clamping portion comprises a third clamping plate and a fourth clamping plate;
the first clamping plate and the second clamping plate are configured to respectively clamp opposite sides of the circuit board;
the third clamping plate and the fourth clamping plate are configured to respectively clamp opposite sides of the chassis;
the second clamping plate comprises a first latching block configured to be locked in the circuit board;
the third clamping plate comprises a second latching block configured to be locked in a latching hole defined in the chassis;
the support member comprises a pressing portion;
two ends of the pressing portion are respectively coupled to the second clamping plate and the third clamping plate; and
the pressing portion is configured to be pressed to drive the second clamping plate and the third clamping plate to bend, thereby disengaging the first latching block and the second latching block from the respective latching holes.

2. The computer of claim 1, wherein:
the support portion comprises a reinforcement block configured to reinforce the support portion.

3. The computer of claim 1, wherein:
the chassis comprises a first side wall, a second side wall, and a third side wall;
the circuit board comprises a first board and a second board;
the first board is fixed to the first side wall;
the second board is installed in a slot of the first board;
one end of the second board is fixed to the third side wall by a fixing member;
the first clamping portion supports an end of the second board away from the third side wall; and
the second clamping portion clamps the second side wall.

4. The computer of claim 3, wherein:
the first side wall, the second side wall, and the third side wall are perpendicular to each other.

5. A support member comprising:
a support portion;
a first clamping portion located on a first end of the support portion; and
a second clamping portion located on a second end of the support portion; wherein:
the first clamping portion is configured to clamp a circuit board;
the second clamping portion is configured to clamp a chassis;
the first clamping portion comprises a first clamping plate and a second clamping plate;
the second clamping portion comprises a third clamping plate and a fourth clamping plate;
the first clamping plate and the second clamping plate are configured to respectively clamp opposite sides of the circuit board;
the third clamping plate and the fourth clamping plate are configured to respectively clamp opposite sides of the chassis;
the second clamping plate comprises a first latching block configured to be locked in the circuit board;
the third clamping plate comprises a second latching block configured to be locked in the chassis;
the support member further comprises a pressing portion;
two ends of the pressing portion are respectively coupled to the second clamping plate and the third clamping plate; and
the pressing portion is configured to be pressed to drive the second clamping plate and the third clamping plate to bend, thereby disengaging the first latching block and the second latching block from the circuit board and the chassis, respectively.

6. The support member of claim 5, wherein:
the support portion comprises a reinforcement block configured to reinforce the support portion.

* * * * *